United States Patent
Chen et al.

(10) Patent No.: US 8,943,683 B2
(45) Date of Patent: Feb. 3, 2015

(54) FABRICATING METHOD OF EMBEDDED PACKAGE STRUCTURE

(71) Applicant: Unimicron Technology Corp., Taoyuan (TW)

(72) Inventors: Tsung-Yuan Chen, Taoyuan County (TW); Ming-Huang Ting, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 14/052,443

(22) Filed: Oct. 11, 2013

(65) Prior Publication Data

US 2014/0033526 A1 Feb. 6, 2014

Related U.S. Application Data

(62) Division of application No. 12/555,210, filed on Sep. 8, 2009, now Pat. No. 8,578,598.

(30) Foreign Application Priority Data

Jun. 12, 2009 (TW) .............................. 98119725 A (51) Int. Cl.
 *H05K 3/20* (2006.01)
 *H05K 3/00* (2006.01)
 (Continued)

(52) U.S. Cl.
 CPC .......... *H05K 3/4007* (2013.01); *H01L 21/6835* (2013.01); *H01L 23/5389* (2013.01); *H01L 24/19* (2013.01); *H01L 24/20* (2013.01); *H01L 24/81* (2013.01); *H01L 24/83* (2013.01); *H01L 24/92* (2013.01); *H05K 1/186* (2013.01); *H01L 24/16* (2013.01); *H01L 24/32* (2013.01); *H01L 24/73* (2013.01); *H01L 2221/68304* (2013.01); *H01L 2221/68359* (2013.01); *H01L 2221/68363* (2013.01); *H01L 2221/68381* (2013.01);
 (Continued)

(58) Field of Classification Search
 USPC ..................... 29/829, 831; 174/260; 257/686; 361/761; 438/112
 See application file for complete search history.

(56) References Cited

U.S. PATENT DOCUMENTS 6,865,089 B2 *  3/2005  Ho et al. .................. 361/761
6,972,964 B2 * 12/2005  Ho et al. .................. 361/761

(Continued)

*Primary Examiner* — David Angwin
(74) *Attorney, Agent, or Firm* — J.C. Patents (57) ABSTRACT

A fabricating method of an embedded package structure includes following steps. First and second boards are combined to form an integrated panel. First and second circuit structures are respectively formed on the first and second boards that are then separated. An embedded element is electrically disposed on the first circuit structure. First and second conductive bumps are respectively formed on a conductive circuit substrate and the second circuit structure. First and second semi-cured films are provided; a laminating process is performed to laminate the first circuit structure on the first board, the first and second semi-cured films, the conductive circuit substrate, and the second circuit structure on the second board. The first and second semi-cured films encapsulate the embedded element. The first and second conductive bumps respectively pierce through the first and second semi-cured films and are electrically connected to the first circuit structure and the conductive circuit substrate, respectively.

12 Claims, 9 Drawing Sheets

(51) Int. Cl.
  *H05K 3/40* (2006.01)
  *H01L 21/683* (2006.01)
  *H01L 23/538* (2006.01)
  *H01L 23/00* (2006.01)
  *H05K 1/18* (2006.01)
  *H05K 3/46* (2006.01)

(52) U.S. Cl.
  CPC ........... *H01L 2221/68386* (2013.01); *H01L 2224/2919* (2013.01); *H01L 2224/321* (2013.01); *H01L 2224/32225* (2013.01); *H01L 2224/73204* (2013.01); *H01L 2224/81005* (2013.01); *H01L2224/81903* (2013.01); *H01L 2224/83005* (2013.01); *H01L 2224/83203* (2013.01); *H01L 2224/8385* (2013.01); *H01L 2224/83862* (2013.01); *H01L 2224/9211* (2013.01); *H01L 2924/01013* (2013.01); *H01L 2924/01029* (2013.01); *H01L 2924/01047* (2013.01); *H01L 2924/01079* (2013.01); *H05K 1/187* (2013.01); *H05K 3/4614* (2013.01); *H05K 3/4647* (2013.01); *H05K 2201/10674* (2013.01); *H05K 2203/063* (2013.01); *H01L 2924/01033* (2013.01); *H01L 2924/0105* (2013.01); *H01L 2924/014* (2013.01); *H01L 2924/0665* (2013.01)
  USPC .............................................. 29/831; 29/829

(56) References Cited

U.S. PATENT DOCUMENTS

| | | | | |
|---|---|---|---|---|
| 7,335,972 | B2* | 2/2008 | Chanchani | 257/686 |
| 7,417,299 | B2* | 8/2008 | Hu | 257/528 |
| 7,436,680 | B2* | 10/2008 | Wang | 361/763 |
| 7,449,363 | B2* | 11/2008 | Hsu | 438/106 |
| 7,550,320 | B2* | 6/2009 | Wang | 438/125 |
| 7,591,067 | B2* | 9/2009 | Wang | 29/832 |
| 7,619,901 | B2* | 11/2009 | Eichelberger et al. | 361/763 |
| 7,790,270 | B2* | 9/2010 | Tomita et al. | 428/210 |
| 7,830,000 | B2* | 11/2010 | Eichelberger et al. | 257/706 |
| 7,839,650 | B2* | 11/2010 | Hsu | 361/761 |
| 7,863,090 | B2* | 1/2011 | Eichelberger et al. | 438/106 |
| 7,868,445 | B2* | 1/2011 | Kohl et al. | 257/690 |
| 7,910,405 | B2* | 3/2011 | Okada et al. | 438/118 |
| 8,125,766 | B2* | 2/2012 | Prymak et al. | 361/328 |
| 8,169,065 | B2* | 5/2012 | Kohl et al. | 257/686 |
| 8,169,072 | B2* | 5/2012 | Uchiyama et al. | 257/700 |
| 8,184,447 | B2* | 5/2012 | Itou et al. | 361/761 |
| 8,216,881 | B2* | 7/2012 | Beer et al. | 438/112 |
| 8,227,927 | B2* | 7/2012 | Chen et al. | 257/797 |
| 8,258,624 | B2* | 9/2012 | Beer et al. | 257/737 |
| 8,320,134 | B2* | 11/2012 | Su et al. | 361/761 |
| 8,324,020 | B2* | 12/2012 | Eichelberger et al. | 438/106 |
| 2004/0001324 | A1* | 1/2004 | Ho et al. | 361/761 |
| 2005/0122698 | A1* | 6/2005 | Ho et al. | 361/761 |
| 2007/0074900 | A1* | 4/2007 | Lee et al. | 174/260 |
| 2007/0278644 | A1* | 12/2007 | Hsu et al. | 257/686 |

* cited by examiner

FABRICATING METHOD OF EMBEDDED PACKAGE STRUCTURE

CROSS-REFERENCE TO RELATED APPLICATION

This application is a divisional application of and claims the priority benefit of U.S. application Ser. No. 12/555,210, filed on Sep. 8, 2009, now allowed, which claims the priority benefit of Taiwan application serial no. 98119725, filed on Jun. 12, 2009. The entirety of each of the above-mentioned patent applications is hereby incorporated by reference herein and made a part of specification.

BACKGROUND OF THE INVENTION

1. Field of the Invention

The present invention relates to a fabricating method of an embedded package structure. More particularly, the present invention relates to a fabricating method of an embedded package structure with multiple layers of circuits.

2. Description of Related Art

Figure 1A:
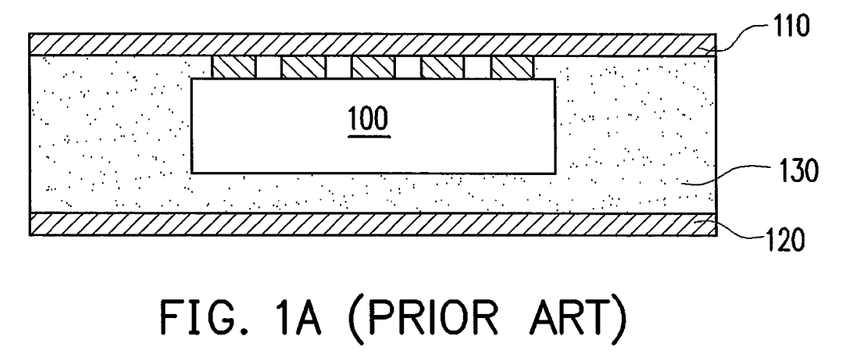
FIGS. 1A~1C are schematic views illustrating a conventional structure having an embedded element and a fabricating method of the conventional structure.
Figure 1B:
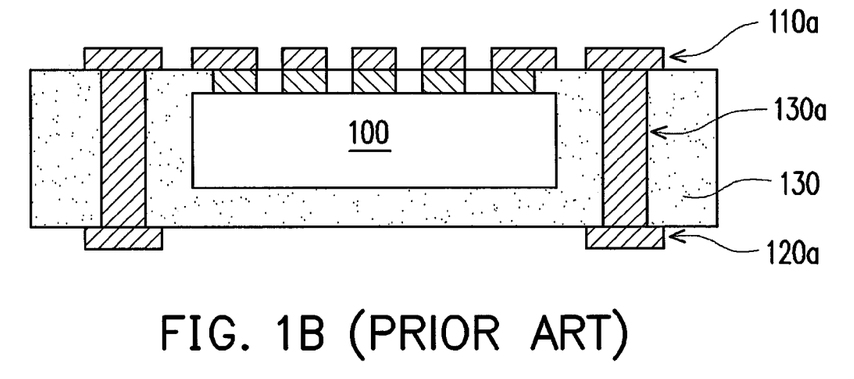
Figure 1C:
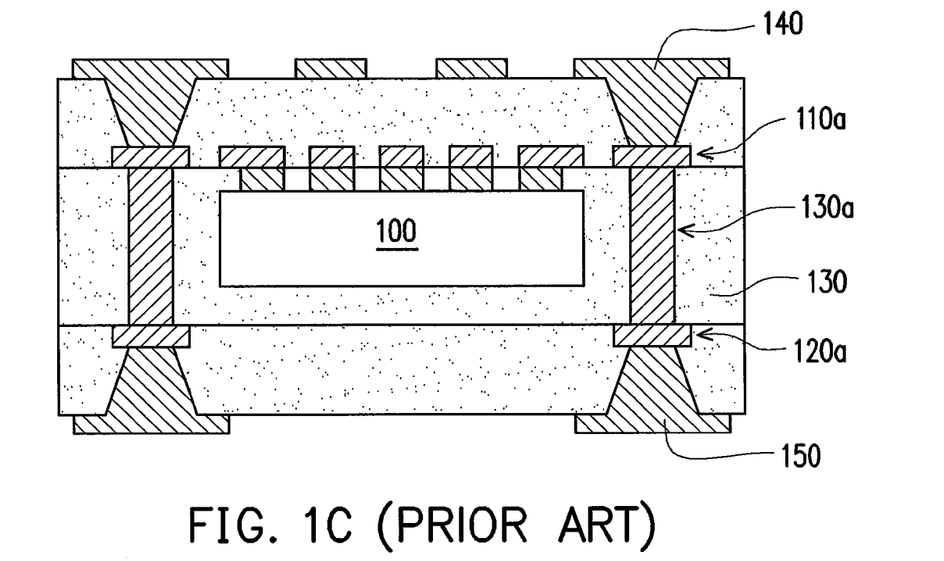

FIGS. 1A~1C are schematic views illustrating a conventional structure having an embedded element and a fabricating method of the conventional structure. First, as shown in FIG. 1A, an embedded element 100 is surface-mounted to two non-patterned metal layers 110 and 120. The two non-patterned metal layers 110 and 120 are laminated respectively to upper and lower sides of a dielectric layer 130, and the dielectric layer 130 is cured through performing a high-temperature baking process. Thereby, the embedded element 100 is encapsulated by the dielectric layer 130 for ensuring the embedded element 100 to operate normally without being affected by external moisture, temperature, or chemical solutions utilized in manufacturing processes. Next, as shown in FIG. 1B, a patterning process and a mechanical drilling process are carried out, such that the two non-patterned metal layers 110 and 120 are etched to form two patterned circuits 110a and 120a that are electrically connected together through a plurality of conductive through holes 130a passing through the dielectric layer 130. As such, required circuit layout is completed. Thereafter, as indicated in FIG. 1C, a process of building up circuit layers is implemented to form a plurality of pads 140 and 150 in the outermost circuit layer. These pads 140 and 150 serve as media of the embedded element 100 for electrical connection and signal transmission to external circuits.

Nonetheless, in the above-mentioned fabricating method, the embedded element 100 is fixed into the two non-patterned metal layers 110 and 120. Therefore, in a subsequently-performed etching process, inaccurate photoresist development, insufficient exposure, or excessive exposure is likely to bring about incomplete or excessive etching, thus resulting in short circuits or open circuits in the patterned circuits. As a result, the embedded element 100 can no longer be used and has to be thrown away. In addition to the above issues arising in the subsequently-performed etching process, the mechanical drilling process, the electroplating process performed on the conductive through holes, and other processes may be required in the aforesaid fabricating method, whereby yield of manufacturing circuits may be reduced. Alternatively, electrical properties of the embedded element 100 may be fatally damaged. Hence, it is imperative to ensure the embedded element 100 to function as normal while high yield of fabricating the circuits and high reliability of the entire package structure are guaranteed as well.

SUMMARY OF THE INVENTION

The present invention is directed to a fabricating method of an embedded package structure for improving manufacturing yield and reliability.

In the present invention, a fabricating method of an embedded package structure including following steps is further provided. In the fabricating method, a first board and a second board are combined to form an integrated panel. A first circuit structure is formed on the first board, and a second circuit structure is formed on the second board. The first board and the second board are then separated. Next, an embedded element is electrically disposed on the first circuit structure, a first conductive bump is formed on a surface of a conductive circuit substrate facing a side of the first circuit structure, and a second conductive bump is formed on the second circuit structure. Thereafter, a first semi-cured film and a second semi-cured film are provided, and a laminating process is performed to laminate the first circuit structure on the first board, the first semi-cured film, the conductive circuit substrate, the second semi-cured film, and the second circuit structure on the second board. The first semi-cured film and the second semi-cured film encapsulate the embedded element. The first conductive bump pierces through the first semi-cured film and is electrically connected to the first circuit structure after the laminating process is performed. The second conductive bump pierces through the second semi-cured film and is electrically connected to the conductive circuit substrate after the laminating process is performed.

According to an exemplary embodiment of the present invention, the step of forming the first circuit structure includes following sub-steps. First, a first circuit layer is formed on the first board. Next, a first dielectric layer is formed to cover the first circuit layer. The first dielectric layer is then patterned to expose a portion of the first circuit layer. Thereafter, a second circuit layer is formed on the first dielectric layer and the portion of the first circuit layer.

According to an exemplary embodiment of the present invention, the step of forming the second circuit structure includes following sub-steps. First, a third circuit layer is formed on the second board. Next, a second dielectric layer is formed to cover the third circuit layer. The second dielectric layer is then patterned to expose a portion of the third circuit layer. Thereafter, a fourth circuit layer is formed on the second dielectric layer and the portion of the second circuit layer.

According to an exemplary embodiment of the present invention, the first board and the second board are bonded together by an isolation layer. Besides, the step of separating the first board from the second board includes cutting a portion of the first board and the second board where the isolation layer is bonded.

According to an exemplary embodiment of the present invention, after the laminating process is performed, the fabricating method further includes removing the second board to expose at least one pad and a circuit layer of the second circuit structure.

According to an exemplary embodiment of the present invention, after the second board is removed, the fabricating method further includes forming a second solder mask layer on the circuit layer, exposing the at least one pad, and forming a second passivation layer on the at least one pad.

According to an exemplary embodiment of the present invention, a method of removing the second board includes peeling, etching, or chemical mechanical polishing (CMP).

According to an exemplary embodiment of the present invention, after the laminating process is performed, the fabricating method further includes removing the first board to expose at least one pad and a circuit layer of the first circuit structure.

According to an exemplary embodiment of the present invention, after the first board is removed, the fabricating method further includes forming a first solder mask layer on the circuit layer, exposing the at least one pad, and forming a first passivation layer on the at least one pad.

According to an exemplary embodiment of the present invention, a method of removing the first board includes peeling, etching, or CMP.

Based on the above, the first circuit structure and the second circuit structure of the present invention are first formed on the first board and the second board of the integrated panel, such that the circuit manufacturing process can be precisely carried out. The first board and the second board are bonded together by an isolation layer. After the first board and the second board are separated from each other, the first circuit substrate on the first board, the semi-cured film, and the second circuit substrate on the second board are laminated. Besides, the embedded element is encapsulated in the semi-cured film to form an embedded package structure. Thereby, potential risk of damaging the embedded element in the conventional process of fabricating the circuits can be reduced. Accordingly, in comparison with the conventional fabricating process and the conventional packaging process, the process of the present invention can achieve high yield of manufacturing circuits and high reliability of the entire package structure under normal operation of the embedded element.

In order to make the aforementioned and other features and advantages of the present invention more comprehensible, several embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

Figure 2A:
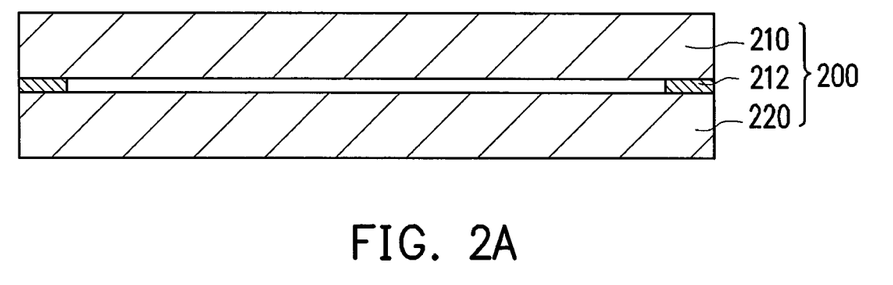
FIGS. 2A~2G are schematic views illustrating a fabricating method of an embedded package structure according to an embodiment of the present invention.
Figure 2B:
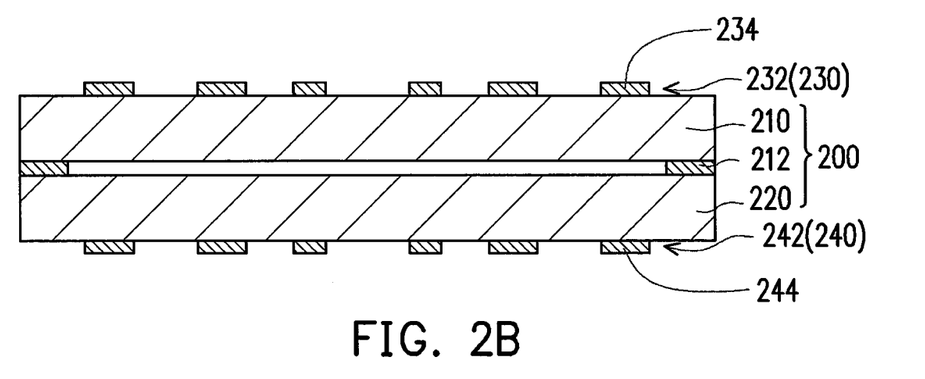

FIGS. 2A~2G are schematic views illustrating a fabricating method of an embedded package structure according to an embodiment of the present invention. As indicated in FIGS. 2A and 2B, a first circuit structure 230 and a second circuit structure 240 are respectively formed on a first board 210 and a second board 220 that are combined to form an integrated panel 200. In the present embodiment, the first circuit structure 230 is formed by first fabricating a first circuit layer 232 on the first board 210. Here, the first circuit layer 232 can be formed by, for example, performing an additive process, performing a semi-additive process, patterning and etching a metal layer (e.g. copper foil), or performing a jet-printing process, performing a transfer printing process, and so on. Besides, the first circuit layer 232 includes at least one interconnect pad 234. Similar to the process of forming the first circuit layer 232 (230), a process of forming the second circuit substrate 240 includes, for example, forming a third circuit layer 242 on the second board 220. The third circuit layer 242 includes at least one interconnect pad 244.

Figure 2C:
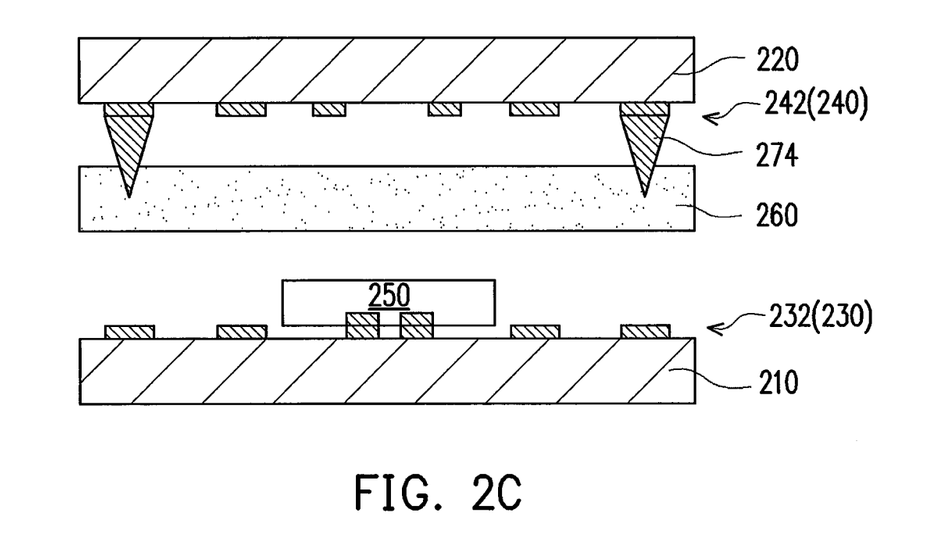
Figure 2D:
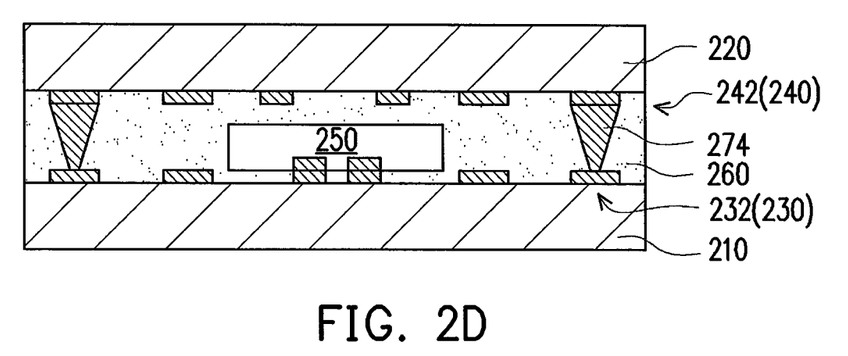

Next, referring to FIGS. 2C and 2D, after the fabrication of the first circuit layer 232 (230) and the third circuit layer 242 (240) is completed, the first board 210 and the second board 220 are separated from each other, and then an embedded element 250 is electrically disposed on the first circuit layer 232 (230). The embedded element 250 is a passive device or an active device, for example, a semiconductor device, an integrated circuit chip, a photoelectric element, a micro mechanical-electrical device, a capacitor, an inductor, a resistor, or the like. Thereafter, a plurality of conductive bumps 274 is formed on the third circuit layer 242 (240). After that, when the first board 210 and the second board 220 face each other, and when a semi-cured film 260 is disposed between the first board 210 and the second board 220, a laminating process is performed to laminate the first circuit layer 232 (230) on the first board 210, the semi-cured film 260, and the third circuit layer 242 (240) on the second board 220. Here, the semi-cured film 260 is pressed by the first and the second boards 210 and 220 and encapsulates the embedded element 250. Besides, the conductive bumps 274 pierce through the semi-cured film 260 and are electrically connected to the first circuit layer 232 (230) after the laminating process is performed.

Figure 2E:
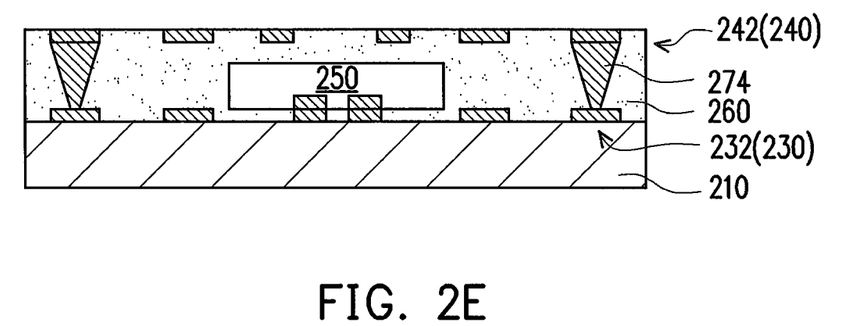
Figure 2F:
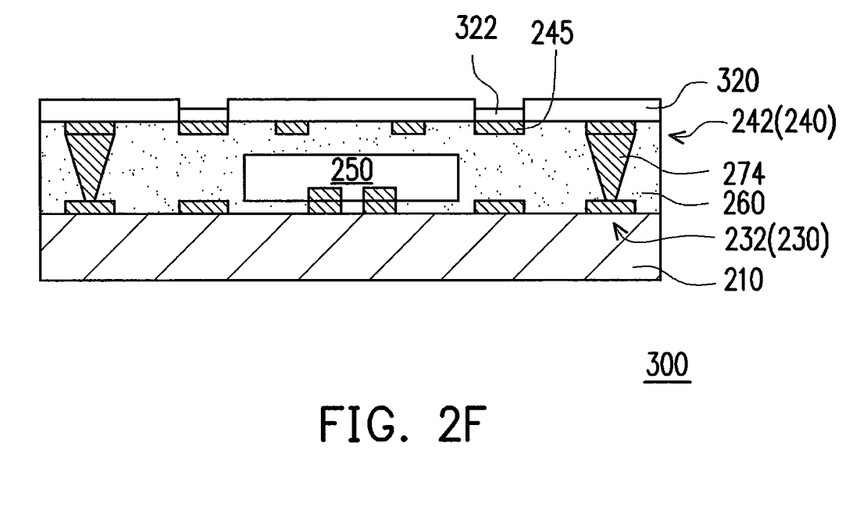
Figure 2G:
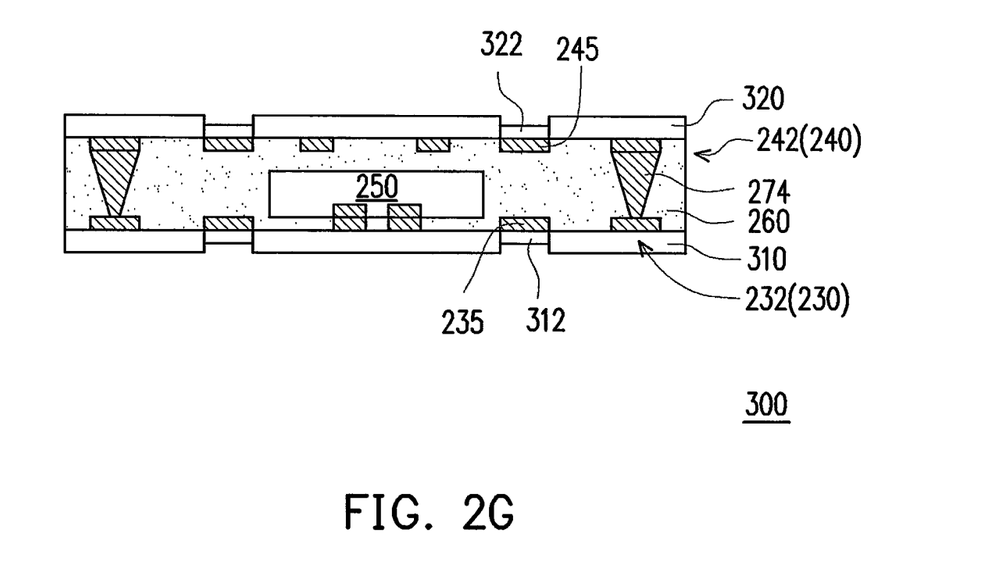

As indicated in FIGS. 2E~2G, after implementation of the laminating process, the second board 220 can be further removed to expose the third circuit layer 242 (240). The second board 220 can be removed by peeling, etching, or CMP, for example. In addition, a second solder mask layer 320 can be further formed on the third circuit layer 242 (240), the at least one pad 245 can be exposed, and a second passivation layer 322 can be formed on the at least one pad 245. The second passivation layer 322 is, for example, an organic protection film, graphite, silver, gold, nickel/gold, tin, a tin alloy, and so on. So far, the embedded package structure 300 is substantially formed.

In another embodiment, after the second board 220 of the embedded package structure 300 is removed, the first board 210 can be further removed to expose the first circuit layer 232 (230). The first board 210 can be removed by peeling, etching, or CMP, for example. In addition, a first solder mask layer 310 can be further formed on the first circuit layer 232 (230), the at least one pad 235 can be exposed, and a first passivation layer 312 can be formed on the at least one pad 235. The first passivation layer 312 is, for example, an organic protection film, graphite, silver, gold, nickel/gold, tin, a tin alloy, and so on.

Figure 3A:
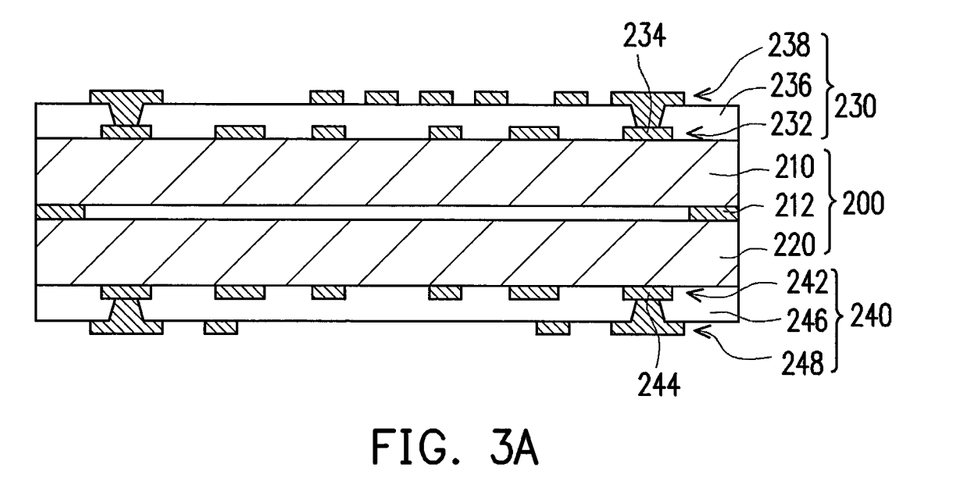
FIGS. 3A~3C are schematic views illustrating an embedded package structure and a fabricating method thereof according to another embodiment of the present invention.

In the following embodiments, a fabricating method of a first circuit structure having a plurality of circuit layers, a fabricating method of a second circuit structure having a plurality of circuit layers, and a fabricating method of an embedded package structure having a plurality of circuit layers are described. As indicated in FIG. 3A, the first circuit layer 232 is covered by a first dielectric layer 236 through performing an additive process, an entire coating process, or a printing process. Here, the first dielectric layer 236 is exemplarily formed by performing the entire coating process or the printing process, such that the first circuit layer 232 is embedded into the first dielectric layer 236. Next, the first dielectric layer 236 is patterned to expose a portion of the first circuit layer (i.e. the at least one interconnect pad 234). A second circuit layer 238 is then formed on the first dielectric layer 236 and the portion of the first circuit layer (i.e. the at least one interconnect pad 234). The second circuit layer 238 is, for example, composed of a metal layer electroplated on the first dielectric layer 236 and a conductive material filling into blind holes, such that the first circuit layer 232 and the second circuit layer 238 are electrically connected to each other through the conductive material in the blind holes. More circuit layers or power sources/grounded planes can be further formed and sequentially stacked in the first circuit structure 230, so as to form layout with more layers of circuits, which is not construed as limited to the present invention.

Similarly, the third circuit layer 242 is covered by a second dielectric layer 246 in the same way as covering the first circuit layer 232 with the first dielectric layer 236, i.e., by performing an additive process, an entire coating process, or a printing process, for example. Here, the second dielectric layer 246 is exemplarily formed by performing the entire coating process or the printing process, such that the third circuit layer 242 is embedded into the second dielectric layer 246. Next, the second dielectric layer 246 is patterned to expose a portion of the third circuit layer (i.e. the at least one interconnect pad 244). A fourth circuit layer 248 is then formed on the second dielectric layer 246 and the portion of the third circuit layer (i.e. the at least one interconnect pad 244) in the same way as forming the second circuit layer 238 on the first dielectric layer 236 and the portion of the first circuit layer (i.e. the at least one interconnect pad 234).

After the first circuit structure 230 and the second circuit structure 240 are completely formed, an electrical property inspection or an optical image analysis can be conducted to determine whether circuit integrity and yield of fabricating the circuits comply with standards, so as to prevent conventional defects resulting from incomplete etching, excessive etching, or non-uniform electroplating.

According to the present embodiment, the integrated panel 200 is, for example, a steel board, an aluminum board, a thermal-conductive plastic material, or a semiconductor substrate for forming the first circuit structure 230 and the second circuit structure 240 on two planar surfaces, respectively. In the present invention, the integrated panel 200 is utilized to form the first and the second circuit structures 230 and 240 in the same way on the same manufacturing conditions instead of individually forming the first and the second circuit structures 230 and 240. Thereby, manufacturing time can be reduced, and the manufacturing process can be simplified. Moreover, after the formation of the first and the second circuit structures 230 and 240, the first board 210 and the second board 220 of the integrated panel 200 can be rapidly separated from each other, which is conducive to implementation of the subsequent laminating process. In detail, the first board 210 and the second board 220 are bonded together through an isolation layer 212 which is a sealing adhesive, such as a solder mask adhesive, epoxy resin, and so forth. The isolation layer 212 is coated at the periphery of the first and the second boards 210 and 220 for preventing the first and the second boards 210 and 220 from being affected by chemicals used in development/etching/electroplating processes. Additionally, the first board 210 and the second board 220 are separated by cutting a portion of the first and the second boards 210 and 220 where the isolation layer 212 is bonded. Namely, the periphery of the first board 210 and the periphery of the second board 220 are cut with use of cutting tools, such that the first and the second boards 210 and 220 are no longer connected to each other.

Figure 3B:
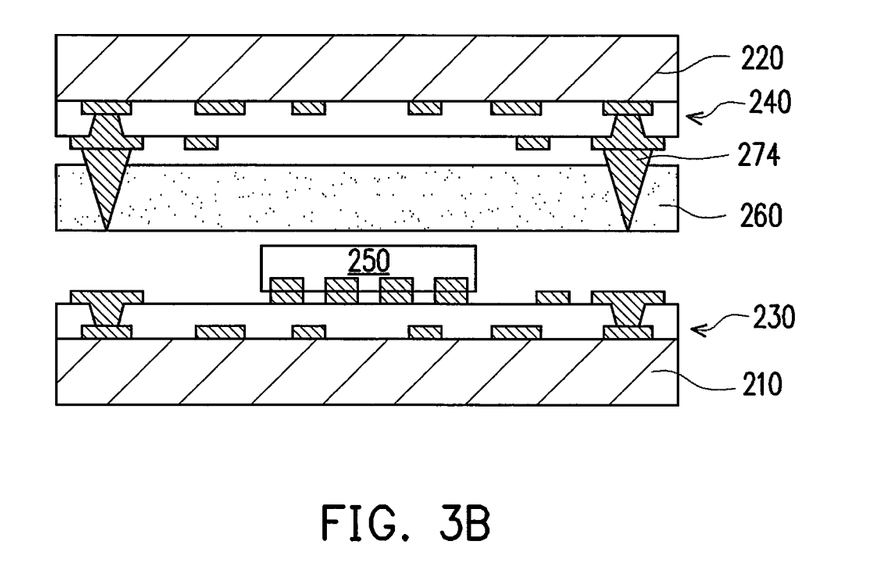
Figure 3C:
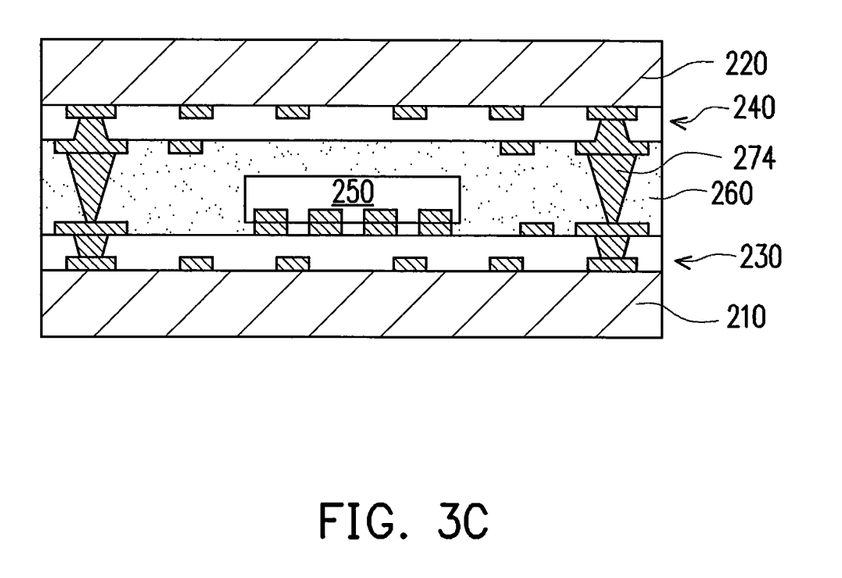

Afterwards, as indicated in FIGS. 3B and 3C, the embedded element 250 is electrically disposed on the first circuit structure 230. The embedded element 250 is a passive device or an active device, for example, a semiconductor device, an integrated circuit chip, a photoelectric element, a micro mechanical-electrical device, a capacitor, an inductor, a resistor, or the like. Thus, the embedded element 250 is electrically disposed on the first circuit structure 230 or the second circuit structure 240 after the process of fabricating the circuits is completed. The first circuit structure 230 on the first board 210, the semi-cured film 260, and the second circuit structure 240 on the second board 220 are then laminated. Here, the semi-cured film 260 can be a film consisting of resin (inorganic compound fillers can be included) or a glass fiber film, and the embedded element 250 can be encapsulated by the semi-cured film 260 pressed by the first board 210 and the second board 220. In addition, during implementation of the laminating process, the semi-cured film 260 is baked at high temperature and cured.

According to the present embodiment, a plurality of conductive bumps 274 is formed on the second circuit structure 240 prior to implementation of the laminating process. The conductive bumps 274 pierce through the semi-cured film 260 and are electrically connected to the first circuit structure 230 after implementation of the laminating process, such that the embedded element 250, the first circuit structure 230, and the second circuit structure 240 are electrically connected all together through the conductive bumps 274. The conductive bumps 274 are in a corn shape and able to easily pierce through the semi-cured film 260. Therefore, the conventional laser drilling process, the conventional mechanical drilling process, or the conventional electroplating process performed on conductive through holes can be omitted to simplify the manufacturing process and reduce the manufacturing costs. The conductive bumps 274 are formed by coat printing, electroless plating, or chemical electroplating. A material of the conductive bumps 274 can be silver, copper, tin, gold, or a combination thereof. A diameter of the bottom of the corn-shaped conductive bumps 274 ranges from 50 µm to 200 µm. A height of the corn-shaped conductive bumps 274 ranges from 25 µm to 100 µm.

Figure 4A:
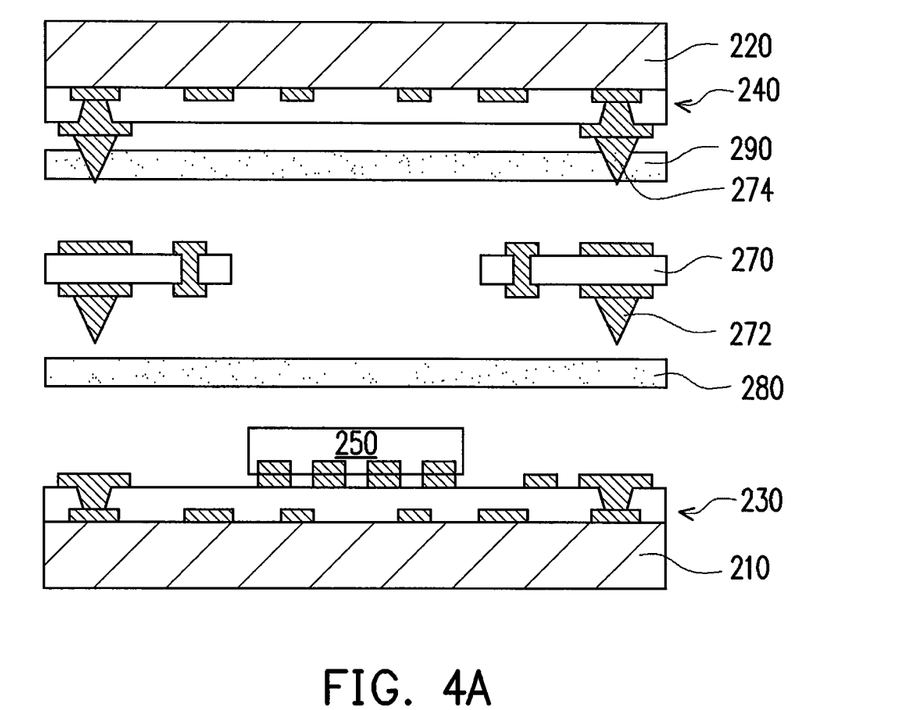
FIGS. 4A~4C are schematic views illustrating an embedded package structure and a fabricating method thereof according to another embodiment of the present invention.
Figure 4B:
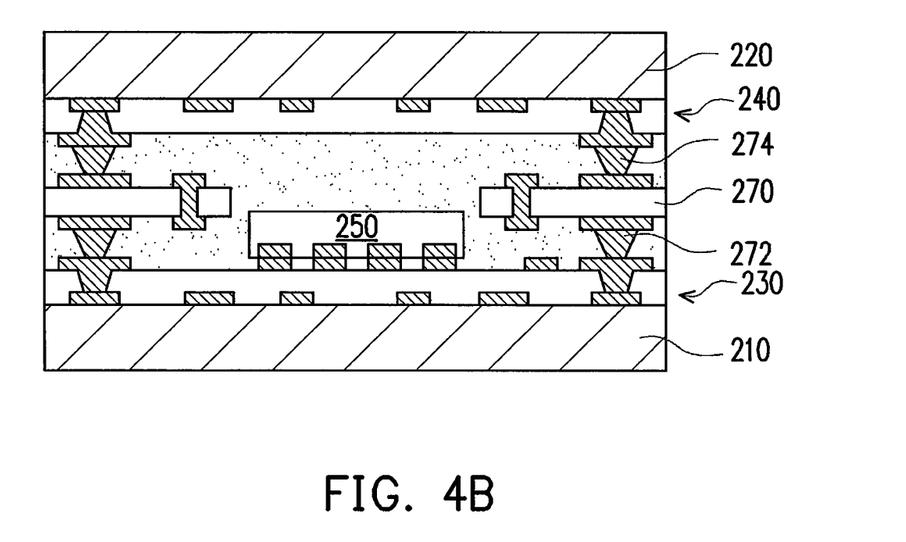
Figure 4C:
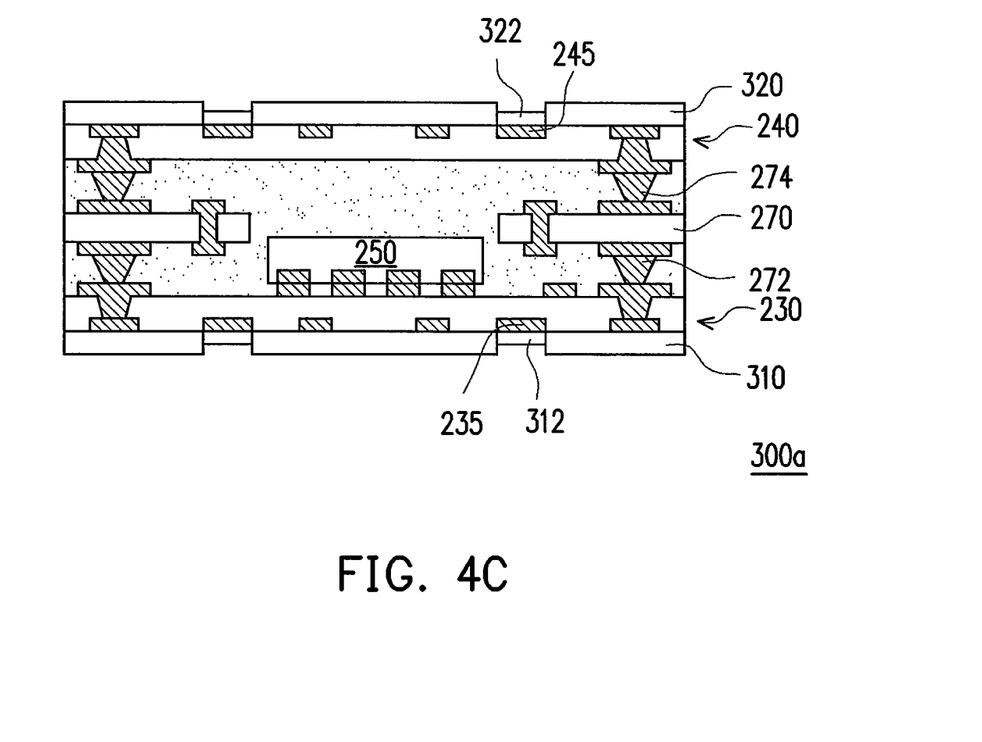

According to another embodiment, first conductive bumps 272 can be formed on a conductive circuit substrate. Specifically, please refer to FIGS. 4A~4C, which are schematic views illustrating an embedded package structure and a fabricating method thereof according to another embodiment of the present invention. First, as shown in FIG. 4A, a first semi-cured film 280, a second semi-cured film 290, and a conductive circuit substrate 270 are provided. The first and the second semi-cured films 280 and 290 can be semi-solid films consisting of resin (inorganic compound fillers can be included) or semi-solid glass fiber films. The conductive circuit substrate 270 can be a thin film circuit layer disposed between the first semi-cured film 280 and the second semi-cured film 290. Second conductive bumps 274 can be formed on a surface of the second circuit structure 240, and the first conductive bumps 272 can be formed on a surface of the conductive circuit substrate 270 facing a side of the first semi-cured film 280. Therefore, the conductive bumps are not limited to be formed on the first/second circuit structures. Next, the first circuit structure 230 on the first board 210, the first semi-cured film 280, the conductive circuit substrate 270, the second semi-cured film 290, and the second circuit structure 240 on the second board 220 are laminated, such that the embedded element 250 is encapsulated by the first semi-cured film 280 and the second semi-cured film 290 after lamination. Here, the first conductive bumps 272 pierce through the first semi-cured film 280 and are electrically connected to the first circuit structure 230 after lamination, and the second conductive bumps 274 pierce through the second semi-cured film 290 and are electrically connected to the conductive circuit substrate 270 after lamination. The first semi-cured film 280 and the second semi-cured film 290 can be cured during lamination. After that, the first board 210 and the second board 220 can be further removed to form an embedded package structure 300a, as indicated in FIG. 4C.

In the embedded package structure 300a of the present embodiment, after the first board 210 is removed, a first solder mask layer 310 can be further formed on the first circuit layer 232, and pads 235 for external connection are then exposed. A first passivation layer 312 (e.g. an organic protection film, graphite, silver, gold, nickel/gold, tin, or a tin alloy) can be also formed on the external pads 235. Additionally, after the second board 220 is removed, a second solder mask layer 320 can be further formed on the third circuit layer 242, and pads 245 for external connection are exposed. A second passivation layer 322 (e.g. an organic protection film, graphite, silver, gold, nickel/gold, tin, or a tin alloy) can be also formed on the pads 245. Here, a method of removing the first board 210 includes peeling, etching, or CMP, and a method of removing the second board 220 includes peeling, etching, or CMP as well. Preferably, prior to fabrication of the first circuit structure 230, a release film (not shown) can be formed on the first board 210, so as to prevent the electrical properties of the first circuit structure 230 from being affected when the first board 210 is subsequently peeled off. Likewise, prior to fabrication of the second circuit structure 240, a release film (not shown) can be formed on the second board 220, so as to prevent the electrical properties of the second circuit structure 240 from being affected when the second board 220 is subsequently peeled off.

Figure 5A:
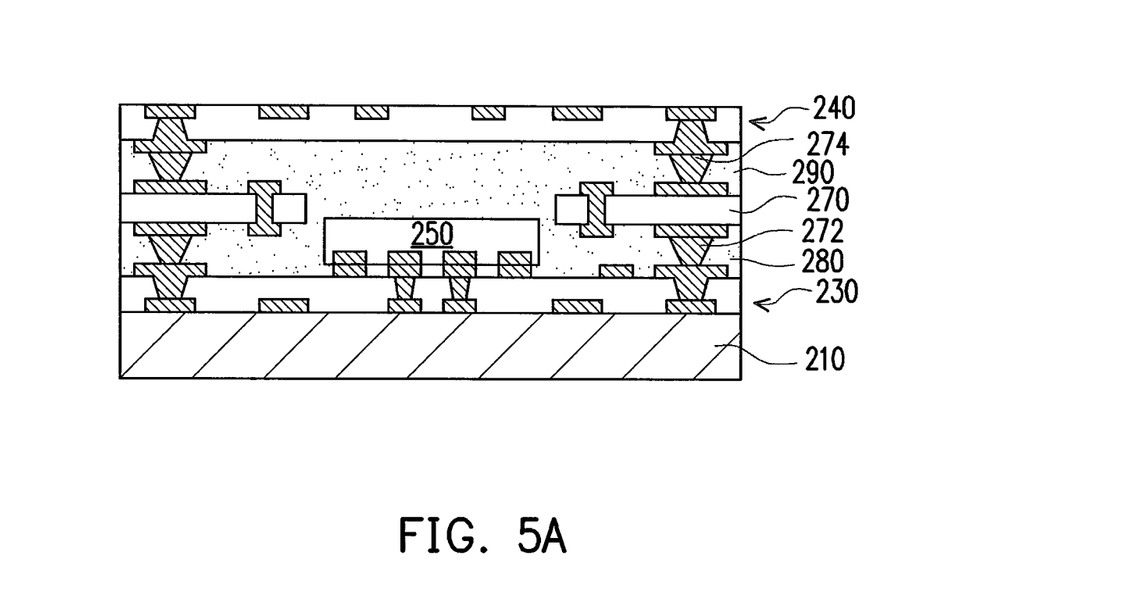
FIGS. 5A~5B are schematic views illustrating an embedded package structure and a fabricating method thereof according to another embodiment of the present invention.
Figure 5B:
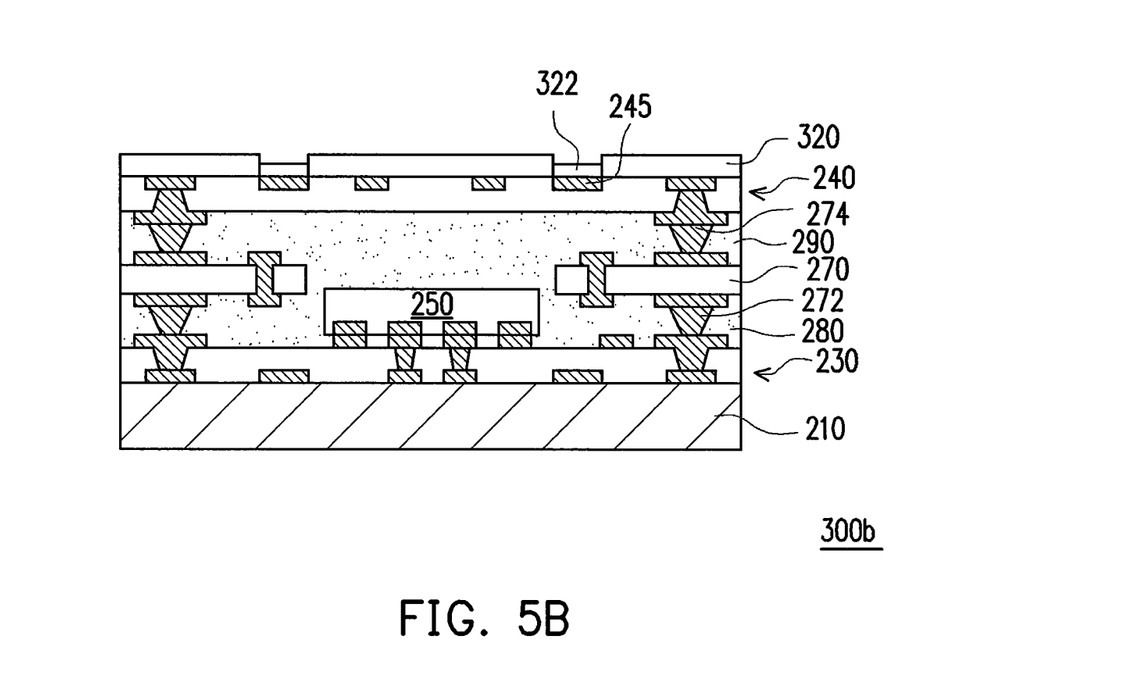

To improve heat dissipation of the embedded package structure or to enhance strength of the entire structure, note that it is not necessary to completely remove the first board 210 or the second board 220. Namely, the first board 210 or the second board 220 can be thinned out or stay as it is. Please refer to FIGS. 5A and 5B, which are schematic views illustrating an embedded package structure and a fabricating method thereof according to another embodiment of the present invention. First, the second board 220 is removed to expose the third circuit layer 242 and at least one pad 245 of the second circuit structure 240. The first board 210 is located outside the embedded element 250 and covers the same. To ensure the embedded element 250 to function normally, the first board 210 can serve as a heat dissipation board, a shielding metal layer preventing radiation and interference of electromagnetic waves, or a grounded plane of the embedded element 250. After the second board 220 is removed, a solder mask layer 320 is then formed on the third circuit layer 242, and the at least one pad 245 acting as a medium of transmitting signals to external circuits is exposed. After the solder mask layer 320 is formed, a passivation layer 322 (e.g. an organic protection film, graphite, silver, gold, nickel/gold, tin, or a tin alloy) can be further formed on the at least one pad 245, so as to preclude the at least one pad 245 from being oxidized.

In light of the foregoing, the first circuit structure and the second circuit structure of the present invention are first formed on the first board and the second board of the integrated panel, such that the circuit manufacturing process can be precisely carried out. The first board and the second board are bonded together by an isolation layer. After the first board and the second board are separated from each other, the first circuit substrate on the first board, the semi-cured film, and the second circuit substrate on the second board are laminated. Besides, the embedded element is encapsulated in the semi-cured film to form an embedded package structure. Thereby, potential risk of damaging the embedded element in the conventional process of fabricating the circuits can be lessened. Alternatively, loss caused by discarding the embedded element due to reduced yield of manufacturing circuits can be prevented. Therefore, in comparison with the conventional process of fabricating and packaging the circuits, the process of the present invention can achieve high yield of manufacturing circuits and high reliability of the entire package structure under normal operation of the embedded element.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A fabricating method of an embedded package structure, comprising:
   combining a first board and a second board to form an integrated panel;
   forming a first circuit structure on the first board and forming a second circuit structure on the second board;
   separating the first board from the second board;
   electrically disposing an embedded element on the first circuit structure;
   forming a first conductive bump on a surface of a conductive circuit substrate, the surface of the conductive circuit substrate facing a side of the first circuit structure;
   forming a second conductive bump on the second circuit structure; and
   providing a first semi-cured film and a second semi-cured film and performing a laminating process to laminate the first circuit structure on the first board, the first semi-cured film, the conductive circuit substrate, the second semi-cured film, and the second circuit structure on the second board, wherein the first semi-cured film and the second semi-cured film encapsulate the embedded element, the first conductive bump pierces through the first semi-cured film and is electrically connected to the first circuit structure after the laminating process is performed, and the second conductive bump pierces through the second semi-cured film and is electrically connected to the conductive circuit substrate after the laminating process is performed.

2. The fabricating method of the embedded package structure as claimed in claim 1, wherein the step of forming the first circuit structure comprises:
   forming a first circuit layer on the first board;
   forming a first dielectric layer to cover the first circuit layer;
   patterning the first dielectric layer to expose a portion of the first circuit layer; and
   forming a second circuit layer on the first dielectric layer and the portion of the first circuit layer.

3. The fabricating method of the embedded package structure as claimed in claim 1, wherein the step of forming the second circuit structure comprises:

forming a third circuit layer on the second board;

forming a second dielectric layer to cover the third circuit layer;

patterning the second dielectric layer to expose a portion of the third circuit layer; and forming a fourth circuit layer on the second dielectric layer and the portion of the second circuit layer.

4. The fabricating method of the embedded package structure as claimed in claim 1, wherein the first board and the second board are bonded together by an isolation layer, and the step of separating the first board from the second board comprises:

cutting a portion of the first board and the second board where the isolation layer is bonded.

5. The fabricating method of the embedded package structure as claimed in claim 1, further comprising removing the second board to expose at least one pad and a circuit layer of the second circuit structure after the laminating process is performed.

6. The fabricating method of the embedded package structure as claimed in claim 5, wherein after the second board is removed, the fabricating method further comprises:

forming a second solder mask layer on the circuit layer and exposing the at least one pad; and forming a second passivation layer on the at least one pad.

7. The fabricating method of the embedded package structure as claimed in claim 5, wherein a method of removing the second board comprises peeling, etching, or chemical mechanical polishing.

8. The fabricating method of the embedded package structure as claimed in claim 1, further comprising removing the first board to expose at least one pad and a circuit layer of the first circuit structure after the laminating process is performed.

9. The fabricating method of the embedded package structure as claimed in claim 8, wherein after the first board is removed, the fabricating method further comprises:

forming a first solder mask layer on the circuit layer and exposing the at least one pad; and forming a first passivation layer on the at least one pad.

10. The fabricating method of the embedded package structure as claimed in claim 8, wherein a method of removing the first board comprises peeling, etching, or chemical mechanical polishing.

11. The fabricating method of the embedded package structure as claimed in claim 1, wherein a method of forming the first conductive bump comprises coat printing, electroless plating, or chemical electroplating.

12. The fabricating method of the embedded package structure as claimed in claim 1, wherein a method of forming the second conductive bump comprises coat printing, electroless plating, or chemical electroplating.

* * * * *